United States Patent [19]

Kanzaki et al.

[11] Patent Number: 4,875,067
[45] Date of Patent: Oct. 17, 1989

[54] PROCESSING APPARATUS

[75] Inventors: Hisao Kanzaki; Hisao Ohba, both of Shizuoka, Japan

[73] Assignee: Fuji Photo Film Co., Ltd., Minami-Ashigara, Japan

[21] Appl. No.: 220,252

[22] Filed: Jul. 18, 1988

[30] Foreign Application Priority Data

Jul. 23, 1987 [JP] Japan ................... 62-184371

[51] Int. Cl.$^4$ .................. G03B 5/04; G03B 3/08
[52] U.S. Cl. ..................... 354/325; 354/322; 15/77
[58] Field of Search ........... 354/317, 319, 320, 322, 354/325, 321; 15/77, 100, 102

[56] References Cited

U.S. PATENT DOCUMENTS

| | | | |
|---|---|---|---|
| 3,589,261 | 6/1971 | Krikelis | 354/322 |
| 3,593,641 | 7/1971 | Adams | 354/317 |
| 3,682,079 | 8/1972 | Casson | 354/319 |
| 4,142,194 | 2/1979 | Hamlin | 354/325 |
| 4,367,030 | 1/1983 | Raymond | 354/322 |
| 4,464,035 | 8/1974 | Schoering | 354/322 |
| 4,687,313 | 8/1987 | Taniguchi et al. | 354/320 |

Primary Examiner—Alan A. Mathews
Attorney, Agent, or Firm—Burns, Doane, Swecker & Mathis

[57] ABSTRACT

A conveying type apparatus for processing light-sensitive plates provided with at least two processing baths, which comprises a roller type device for removing a processing solution from the plate processed, wherein said device comprises a pair of squeeze rollers and is disposed at the boundary between a preceding bath and an adjacent subsequent bath so as to separate the solutions in these baths from one another; and means for removing the processing solution on the roller surface. This processing apparatus is small-sized one, requires a small space to occupy and makes it possible to reduce the operation and production cost since the number of squeeze rollers required to prevent the processing solutions from causing admixing with one another due to the solutions carried over by a processed plates.

11 Claims, 2 Drawing Sheets

PROCESSING APPARATUS

BACKGROUND OF THE INVENTION

1. Field of the Invention

The present invention relates to a processing apparatus of a conveying type having at least two processing baths, which makes it possible to effectively prevent a solution in a processing bath and that in the bath preceding the same from causing admixing with one another.

2. Description of the Prior Art

In a processing apparatus of a conveying type having at least two processing baths, it is generally required that the apparatus is designed so as to reduce the amount of a processing solution carried over, by a processed material or other members of the apparatus such as means for spraying the processed material with a processing solution, from a preceding bath to a subsequent bath or vice versa as low as possible. For that purpose, squeeze rollers are disposed at the outlet of the preceding processing bath to prevent the solution in the preceding bath from being carried over by a processed material therefrom to that in the subsequent bath. Moreover, guide rollers are disposed at the inlet of the subsequent bath to prevent the processing solution in the subsequent bath from being carried over by the rotatable squeeze roller therefrom to the preceding bath.

In particular, when a presensitized plate for use in making lithographic printing plate (hereunder referred to as "PS plate(s)"), which has been imagewise exposed to light, is processed in a conveying type processing apparatus, it is of primary importance to reduce the amount of each processing solution carried over, by the PS plate from a processing bath to other processing baths or vice versa as low as possible.

A lithographic printing plate can generally be prepared by the imagewise exposing to light of a PS plate composed of a substrate provided thereon with a light-sensitive resin layer, developing and at least one processing selected from the group consisting of water washing, rinsing and desensitization.

In such a case, if a large amount of each processing solution is carried over by the processed PS plate which is conveyed through each processing device, for instance, from the developing bath to the water washing or rinsing bath; from the water washing or rinsing bath to the developing bath; from the developing bath to the desensitizing bath; from the desensitizing bath to the developing bath; from the water washing or rinsing bath to the desensitizing bath; and from the desensitizing bath to the water washing or rinsing bath, each processing solution is deteriorated within a very short period of time.

In order to prevent the deterioration of each processing solution due to admixing with other processing solutions which are possibly carried over by the processed PS plate from the preceding baths or by a means for spraying the plate with a processing solution from the next baths, a pair of squeeze rollers are disposed at both upstream and downstream sides of each processing bath. Moreover, a device for spraying the surface of a processed plate with each processing solution, in a spraying type processing apparatus, is placed at the upstream and/or downstream sides of the squeeze rollers as already mentioned above. In such a conventional apparatus for making lithographic printing plates, at least two pairs of rollers are disposed in each processing bath, which, therefore, makes the apparatus very expensive and large-sized, and, thus, the apparatus occupies a greater space.

SUMMARY OF THE INVENTION

Accordingly, it is a primary purpose of the present invention to provide a small-sized processing apparatus, for instance, an apparatus for making a lithographic printing plate from a PS plate, which occupies a small space and which permits the lowering of the operation cost and the production cost.

The aforementioned and other purposes of the present invention can effectively be accomplished by providing a conveying type apparatus for processing light-sensitive plates such as PS plates, provided with at least two processing baths, which comprises a roller type device for removing a processing solution from the plate processed, wherein said device comprises a pair of rollers and is disposed at each boundary between a preceding bath and an adjacent subsequent bath so as to separate the solutions in these baths from one another; and means for removing the processing solution on the roller surface.

BRIEF EXPLANATION OF THE ACCOMPANYING DRAWINGS

The processing apparatus of the present invention will hereunder be explained in more detail with reference to the attached drawings, in which FIGS. 1 and 3 are schematic diagrams illustrating embodiments of the apparatuses for processing PS plates and the like or for making lithographic printing plates (hereunder also referred to as "plate-making apparatus") according to the present invention;

FIG. 2 is a diagram illustrating an embodiment of the conventional plate-making apparatus; and FIG. 4 is an enlarged detail of the squeeze rollers for removing processing solutions in accordance with the present invention.

DESCRIPTION OF THE PREFERRED EMBODIMENTS OF THE INVENTION

First of all, when referring to any pair of adjacent baths throughout the present specification, the bath disposed upstream on the basis of the moving direction of a processed material is referred to as "preceding bath" and the other disposed downstream (i.e., the bath situating immediately after the preceding bath) as "subsequent bath".

Figure 1:
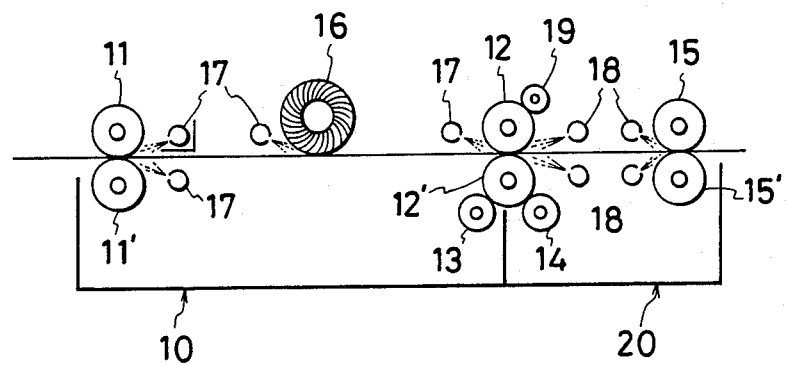
Figure 3:
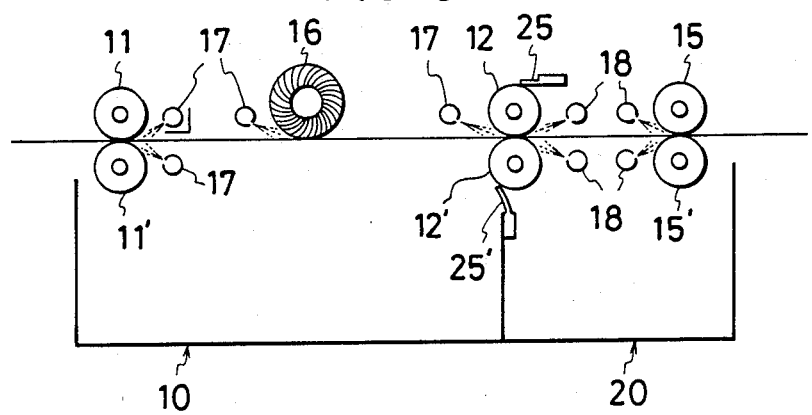

In the processing apparatus of this invention, specific examples of the means for removing processing solutions from a pair of squeeze rollers of the device for separating two neighboring processing solutions from one another includes those comprising three rollers as described in FIG. 1, whose first roller 13 is pressed against the lower roller 12' of the paired rollers and is disposed on the side of the preceding bath, whose second roller 14 is pressed to the lower roller 12' of the paired rollers and is disposed on the side of the subsequent bath and whose third roller 19 is pressed to the upper roller 12 of the paired rollers and is disposed on the side of the subsequent bath; or those comprising two blades as described in FIG. 3, one (25') of which is pressed, on the side of the preceding bath, against the lower roller 12' of the paired rollers and the other (25) of which is pressed, on the side of the subsequent bath, to the upper roller 12 of the paired rollers. Adopting such a construction, it becomes possible to omit a pair of conveyor rollers which are required in the conventional processing apparatus and is disposed upstream of a device for spraying a processed plate with a processing solution.

Figure 4:
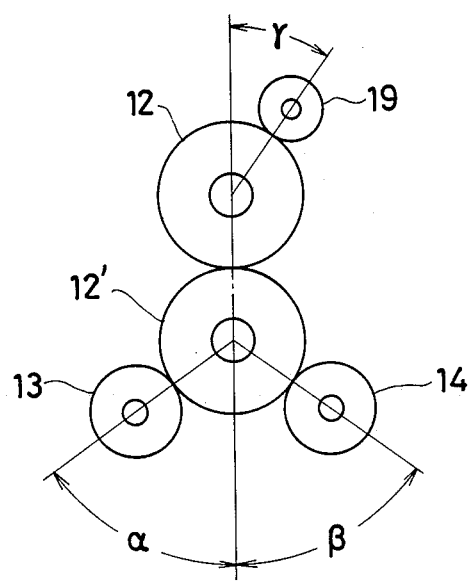

In FIG. 4, alpha α is the angle between a vertical line passing through the center of a rotational axis of the lower roller 12' and a straight line passing through the center of said rotational axis and that of a roller 13, beta β likewise the angle between a straight line passing through the rotational center of a roller 14 and tha of the roller 12' and said vertical line, and gamma γ the angle between a vertical line passing through the center of the rotational axis of a roller 12 and a straight line passing through the rotational centers of the roller 12 and a roller 19.

Both alpha and beta are desirably 10° to 60° and preferably 20° to 50° respectively while gamma is suitably 0° to 90° and preferably more than 0° and not more than 80°.

The diameter of the roller 13 or 14 relative to that of the roller 12' (which is defined to be 100) preferably ranges from 50 to 90. In addition, the diameter of the roller 19 relative to that of the roller 12 (which is defined to be 100) preferably ranges from 10 to 100.

In the present invention, the hardness of the rollers (13 and 14) for removing processing solutions is not more than 80°, preferably not more than 60° and more preferably not more than 45° expressed in Vickers hardness. On the other hand, the blades used herein are, for instance, those made of rubber, resins or metals, preferably those of rubber or resins and more preferably those of rubber.

The nip pressure between the upper and lower squeeze rollers preferably ranges from 0.1 to 20 kg/cm$^2$, more preferably from 0.5 to 10 kg/cm$^2$.

As explained above, the conventional processing apparatus requires the use of two pairs of rollers for squeezing out the processing solution carried over by the processing material in each of the developing bath, the rinsing bath and/or the desensitizing bath. On the contrary, in the processing apparatus of this invention, it is sufficient to use only a pair of rollers for squeezing out the processing solution carried over by the processed material in each processing bath. As a result, the roller cost can be cut to not more than about ⅔ compared with the conventional apparatus, the processing apparatus can be miniaturized and the space for the apparatus to occupy can also be reduced to not more than 80% of that of the conventional one.

The processing apparatus of the present invention can efficiently be applied to the processing of, particularly, PS plates which are each composed of a substrate and light-sensitive layers applied to one or both sides thereof. The concept of the present invention may be applied to dipping type processing apparatuses and declined conveying type processing apparatuses.

The processing apparatus of this invention will hereunder be explained in more specifically with reference to the following non-limitative examples.

EXAMPLE 1

A preferred embodiment of the plate-making apparatus of this invention is shown in FIG. 1, which principally comprises a developing device 10 and a rinsing or desensitizing device 20.

If necessary, the processing apparatus may comprises at least two such devices connected to one another. The developing device 10 comprises a pair of guide rolls 11, 11' for introducing thereinto a plate to be processed, a device 17 for spraying the plate with a developer, a rotating brush 16 and a pair of squeeze rollers 12, 12'. On the other hand, the rinsing or desensitizing device 20 comprises a device 18 for spraying the processed plate with a rinsing solution or a desensitizing solution and a pair of squeeze rollers 15, 15'. The present invention is not limited to the processing apparatus comprising such a processing solution-spraying system and the concept of this invention may be extended to processing apparatuses of a dipping type, a brushless type and other commonly used types.

A pair of squeeze rollers 12 and 12' coated with silicone rubber is disposed at the nip pressure of 5 kg/cm$^2$ between the developing device 10 and the rinsing or desensitizing device 20, a squeeze roller 13 coated with silicone rubber (alpha=45°; the diameter thereof relative to the roller 12'=75%) is pressed to the lower roller 12' on the side of the developing bath to remove the developer from the lower roller 12' and a squeeze roller 14 coated with silicone rubber (beta=45°; the diameter thereof relative to the roller 12'=75%) and a steel squeeze roller 19 (gamma=10°) are pressed to the squeeze rollers 12 and 12' on the side of the rinsing or desensitizing bath respectively to remove the rinsing or desensitizing solution from the rollers 12 and 12'. As seen from FIG. 1, a pair of conveyor rollers to be disposed upstream of the rinsing or desensitizing device in the conventional apparatus is omitted.

In printing operation, the lithographic printing plate thus obtained gave printed matters having the same good quality as that of those conventionally obtained.

Figure 2:
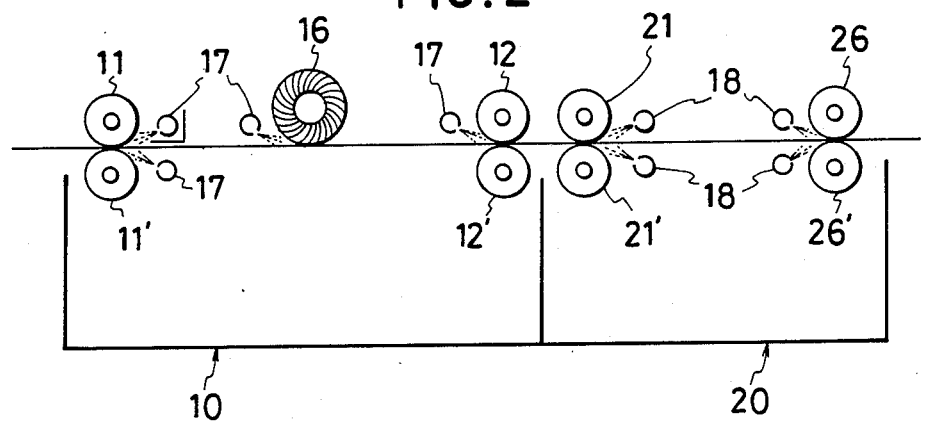

In the conventional apparatus as shown in FIG. 2, a space of 10 to 15 cm wide was required to place a pair of squeeze rollers between the developing device 10 and the rinsing or desensitizing device 20. On the contrary, such a space could be omitted in the apparatus of this invention.

EXAMPLE 2

A second preferred embodiment of the plate-making apparatus in accordance with the present invention is shown in FIG. 3, which also principally comprises a developing device 10 and a rinsing or desensitizing device 20. The apparatus may likewise comprise at least two such devices connected to each other. The developing device 10 comprises a pair of guide rolls 11, 11' for introducing a plate to be processed thereinto, a device 17 for spraying the plate with a developer, a rotatable brush 16 and a pair of squeeze rollers 12, 12'. The present invention is not limited to the processing apparatus comprising processing solution-spraying systems shown in FIG. 3 and the concept of this invention may be applied to processing apparatuses of a dipping type, a brushless type and other commonly used types.

On the other hand, the rinsing or desensitizing device 20 comprises a device 18 for spraying the processed plate with a rinsing or desensitizing solution and a pair of squeeze rollers 15, 15'. The device 20 further comprises a blade 25 for preventing a counter flow of the rinsing or desensitizing solution and a blade 25' for preventing the developer from being carried over from the developing bath to the subsequent bath (i.e., the rinsing or desensitizing device).

As seen from FIG. 3, a pair of conveyor rollers to be disposed upstream of the rinsing or desensitizing device in the conventional apparatus is omitted.

In printing operation, the lithographic printing plate thus obtained gave printed matters having the same good quality as that of those conventionally obtained.

In the conventional apparatus as shown in FIG. 2, a space of 10 to 15 cm wide was required to place a pair of squeeze rollers between the developing device 10 and the rinsing or desensitizing device 20. On the contrary, such a space could be omitted in the apparatus of this invention.

What is claimed is:

1. A conveying type apparatus for processing light-sensitive plates provided with at least two processing baths which comprises a roller type device for removing a processing solution from the plate processed, wherein said device comprises a pair of squeeze rollers and is disposed at the boundary between a preceding bath and an adjacent subsequent bath so as to separate the solutions in these baths from one another; and means for removing the processing solution on the roller surface;

wherein the means for removing a processing solution comprises a roller pressed against a lower roller of the paired rollers and disposed on the side of the preceding bath, a roller pressed to the lower roller of the paired rollers and disposed on the side of the subsequent bath and a roller pressed to an upper roller of the paired rollers and disposed on the side of the subsequent bath.

2. A processing apparatus of claim 1 wherein the processing baths are those for developing, rinsing and/or desensitizing a presensitized plate for use in making lithographic printing plates, which has been imagewise exposed to light.

3. A processing apparatus of claim 1 wherein the hardness of the rollers for removing a processing solution is not more than 80° expressed in Vickers hardness.

4. A processing apparatus of claim 3 wherein the hardness of the rollers for removing a processing solution is not more than 60° expressed in Vickers hardness.

5. A processing apparatus of claim 3 wherein the hardness of the rollers for removing a processing solution is not more than 45° expressed in Vickers hardness.

6. A processing apparatus of claim 1 wherein the nip pressure between the upper and lower squeeze rollers ranges from 0.1 to 20 kg/cm².

7. A processing apparatus of claim 6 wherein the nip pressure between the upper and lower squeeze rollers ranges from 0.5 to 10 kg/cm².

8. A processing apparatus of claim 1 wherein the developing device is a developer spraying type, a dipping type or a brushless type.

9. A processing apparatus of claim 1 wherein the apparatus is a dipping type processing apparatus or an declined conveying type processing apparatus.

10. A processing apparatus of claim 1 wherein an angle ($\alpha$) between a vertical line passing through the center of a rotational axis of the lower roller and a straight line passing through the center of the rotational axis and that of the roller pressed against the lower roller and disposed on the side of the preceding bath is 10° to 60°, an angle ($\beta$) between the vertical line passing through the center of the rotational axis and a straight line passing through the center of the rotational axis and that of the roller pressed against the lower roller and disposed on the side of the subsequent bath is 10° to 60° and an angle ($\gamma$) between a vertical line passing through the center of the rotational axis of the upper roller and a straight line passing through the rotational center of the upper roller and that of the roller pressed to the upper roller and disposed on the side of the subsequent bath is 0° to 90°.

11. A processing apparatus of claim 10, wherein the angle ($\alpha$) and the angle ($\beta$) are 20° to 50° and the angle ($\gamma$) is 0° to 80°.

* * * * *